(12) United States Patent
Saito

(10) Patent No.: US 9,551,476 B2
(45) Date of Patent: Jan. 24, 2017

(54) LIGHT FLUX CONTROLLING MEMBER AND LIGHT EMITTING DEVICE

(71) Applicant: Enplas Corporation, Saitama (JP)

(72) Inventor: Tomohiro Saito, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 217 days.

(21) Appl. No.: 14/373,370

(22) PCT Filed: Jan. 17, 2013

(86) PCT No.: PCT/JP2013/000174
§ 371 (c)(1),
(2) Date: Jul. 21, 2014

(87) PCT Pub. No.: WO2013/111534
PCT Pub. Date: Aug. 1, 2013

(65) Prior Publication Data
US 2014/0355273 A1    Dec. 4, 2014

(30) Foreign Application Priority Data

Jan. 27, 2012    (JP) .................................. 2012-015270

(51) Int. Cl.
*F21V 7/00*    (2006.01)
*F21V 13/04*    (2006.01)
(Continued)

(52) U.S. Cl.
CPC ................. *F21V 13/04* (2013.01); *F21V 5/04* (2013.01); *F21V 5/045* (2013.01); *G02B 3/08* (2013.01);
(Continued)

(58) Field of Classification Search
CPC .................................. F21V 13/04; F21V 5/04
See application file for complete search history.

(56) References Cited

U.S. PATENT DOCUMENTS

| 2007/0263390 A1* | 11/2007 | Timinger | ................... | F21L 4/00 |
| | | | | 362/308 |
| 2010/0080012 A1* | 4/2010 | Bernard | ................... | F21V 5/04 |
| | | | | 362/509 |

(Continued)

FOREIGN PATENT DOCUMENTS

| JP | 2011-141503 A | 7/2011 |
| JP | 2011-192494 A | 9/2011 |

(Continued)

*Primary Examiner* — Evan Dzierzynski
(74) *Attorney, Agent, or Firm* — Brundidge & Stanger, P.C.

(57) ABSTRACT

A luminous flux control member (100) has: a light input region (110), to which light having been outputted from a light emitting element (210) is inputted; and a light output region (150), from which the light having been inputted from the light input region (110) is outputted. The input region (110) has: a refracting section (120); a reflection fresnel lens section (130), which is positioned outside of the refracting section (120); and a reflecting surface (140), which is positioned outside of the reflection fresnel lens section (130). The reflecting surface (140) reflects, toward the light output region (150), the light which has been inputted to the reflection fresnel lens section (130), and which has not been reflected (the light leaked from the reflection fresnel lens section (130)).

5 Claims, 15 Drawing Sheets

(51) Int. Cl.
*F21V 5/04*      (2006.01)
*G02B 3/08*      (2006.01)
*G02B 19/00*     (2006.01)
*H01L 33/58*     (2010.01)
*F21Y 101/00*    (2016.01)

(52) U.S. Cl.
CPC ....... G02B 19/0028 (2013.01); G02B 19/0061 (2013.01); *F21Y 2101/00* (2013.01); *H01L 33/58* (2013.01)

(56) References Cited

U.S. PATENT DOCUMENTS

2011/0216543 A1  9/2011  Kayanuma
2011/0261569 A1  10/2011  Kayanuma

FOREIGN PATENT DOCUMENTS

| JP | 2011-222380 A | 11/2011 |
| JP | 2011-232512 A | 11/2011 |
| JP | 2012-243396 A | 12/2012 |
| JP | 2013-012632 A | 1/2013 |

* cited by examiner

PRIOR ART

LIGHT FLUX CONTROLLING MEMBER AND LIGHT EMITTING DEVICE

TECHNICAL FIELD

The present invention relates to a light flux controlling member that controls a distribution of light emitted from a light emitting element, and a light emitting device including the light flux controlling member.

BACKGROUND ART

In recent years, in view of energy saving and environmental conservation, light emitting devices (LED flashes) using a light-emitting diode (hereinafter also referred to as "LED") as a light source have been increasingly used for a light emitting device in an imaging camera. A well-known example of such light emitting devices is a light emitting device using a combination of an LED and a Fresnel lens (see, for example, PTL 1).

FIG. 1A is a sectional view of the light emitting device disclosed in PTL 1. As illustrated in FIG. 1A, light emitting device 10 disclosed in PTL 1 includes substrate 20, light source substrate 21, light source 30 including a light emitting element and a phosphor, and Fresnel lens 40. Fresnel lens 40 is disposed on substrate 20 in such a manner as to face the light emitting surface of light source 30.

FIG. 1B is a sectional view of Fresnel lens 40. As illustrated in FIG. 1B, refractive Fresnel lens section 41 and reflective Fresnel lens section 42 are formed on one side of Fresnel lens 40. Refractive Fresnel lens section 41 is formed at a position which faces light source 30. Reflective Fresnel lens section 42 is formed around refractive Fresnel lens section 41 in such a manner as to surround light source 30. In Fresnel lens 40, the surface on which refractive Fresnel lens section 41 and reflective Fresnel lens section 42 are formed functions as incidence region 43, and the surface on the side opposite to incidence region 43 functions as emission region 44.

In light emitting device 10 illustrated in FIG. 1A, light emitted in a forward direction (upward direction in the drawing) from light source 30 is refracted in a predetermined direction at refractive Fresnel lens section 41, and is then output from emission region 44. On the other hand, light emitted in a lateral direction (horizontal direction in the drawing) from light source 30 is incident on incidence surface 45 of reflective Fresnel lens section 42, and is reflected in a predetermined direction by reflecting surface 46, and is then, output from emission region 44. In this manner, light emitting device 10 disclosed in PTL 1 controls the distribution of the light emitted from light source 30 with use of Fresnel lens 40 including refractive Fresnel lens section 41 and reflective Fresnel lens section 42.

CITATION LIST

Patent Literature

[PTL 1] Japanese Patent Application Laid-Open No. 2011-192494

SUMMARY OF INVENTION

Technical Problem

Fresnel lens 40 disclosed in PTL 1 utilizes not only the light emitted in a forward direction from light source 30, but also the light emitted in a lateral direction from light source 30, and thus can brightly illuminate the irradiation target region. However, Fresnel lens 40 disclosed in PTL 1 has a problem that the leaked light from reflective Fresnel lens section 42 cannot be effectively utilized.

Generally, the form of reflective Fresnel lens section 42 is optimized such that the distribution of the light from the light emission center of light source 30 can be controlled to a desired distribution. However, light source 30 emits light by surface-emission, and therefore the light is emitted also from a peripheral portion of light source 30. Consequently, after entering from incidence surface 45 of reflective Fresnel lens section 42, part of light from a peripheral portion of light source 30 is not reflected by reflecting surface 46 and becomes leaked light, as illustrated in FIG. 2. As a result, as shown by the arrow in FIG. 2, part of the light from a peripheral portion of light source 30 becomes stray light 50. Such stray light degrades the light use efficiency of Fresnel lens 40. That is, Fresnel lens 40 disclosed in PTL 1 has a room for improvement in light use efficiency, by limiting the generation of stray light.

A conceivable method for limiting the generation of stray light derived from leaked light from a reflective Fresnel lens section in a light flux controlling member (lens) including the reflective Fresnel lens section is increasing the size of the light flux controlling member relative to the light source, or miniaturizing the form of the reflective Fresnel lens section. Both methods can limit the generation of stray light by limiting the generation of leaked light from the reflective Fresnel lens section. However, the former method cannot meet the demand of downsizing, and the latter method degrades the manufacturing performance. For this reason, it is not easy to improve the light use efficiency of a light flux controlling member by limiting the generation of leaked light.

Meanwhile, even when light is leaked from the reflective Fresnel lens section, the light use efficiency of the light flux controlling member may possibly be improved when the leaked light can be utilized.

An object of the present invention is to provide a light flux controlling member which include a reflective Fresnel lens section and can effectively utilize leaked light from the reflective Fresnel lens section. In addition, another object of the present invention is to provide a light emitting device including the light flux controlling member.

Solution to Problem

A light flux controlling member of an embodiment of the present invention controls a distribution of light emitted from a light emitting element, the light flux controlling member including: an incidence region on which light emitted from a light emitting element is incident; and an emission region from which light incident on the incidence region is emitted, wherein the incidence region includes a refraction section on which part of light emitted from the light emitting element is incident, the refraction section being configured to refract incident light toward the emission region, a reflective Fresnel lens section which is disposed outside the refraction section, and on which part of light emitted from the light emitting element is incident, the reflective Fresnel lens section being configured to reflect incident light toward the emission region, and a reflecting surface which is disposed outside the reflective Fresnel lens section, the reflecting surface being configured to reflect, toward the emission region, light which is incident on the reflective Fresnel lens section and is not reflected by the reflective Fresnel lens section, the reflective Fresnel lens section includes a plurality of concentric annular projections, each of the projections including a first inclined surface on which part of light emitted from the light emitting element is incident and a second inclined surface configured to reflect light incident on the first inclined surface toward the emission region, and an angle of the reflecting surface with respect to an optical axis of the light emitting element is smaller than an angle of the second inclined surface provided at an outermost position with respect to the optical axis of the light emitting element.

A light emitting device of an embodiment of the present invention includes: a light emitting element; and the light flux controlling member.

Advantageous Effects of Invention

The light flux controlling member of the embodiment of the present invention can effectively utilize also the leaked light from reflective Fresnel lens section with use of the reflecting surface, and thus is excellent in light use efficiency. In addition, in the light flux controlling member of the embodiment of the present invention, the leaked light from the reflective Fresnel lens section does not become stray light, and thus it is possible to limit the influence of the stray light on the other components. Therefore, the light emitting device including the light flux controlling member of the embodiment of the present invention has only a little influence on the other components, and is excellent in light use efficiency.

DESCRIPTION OF EMBODIMENTS

Hereinafter, an embodiment of the present invention will be described in detail with reference to the accompanying drawings.

[Configuration of Light Flux Controlling Member and Light Emitting Device]

Figure 1A:
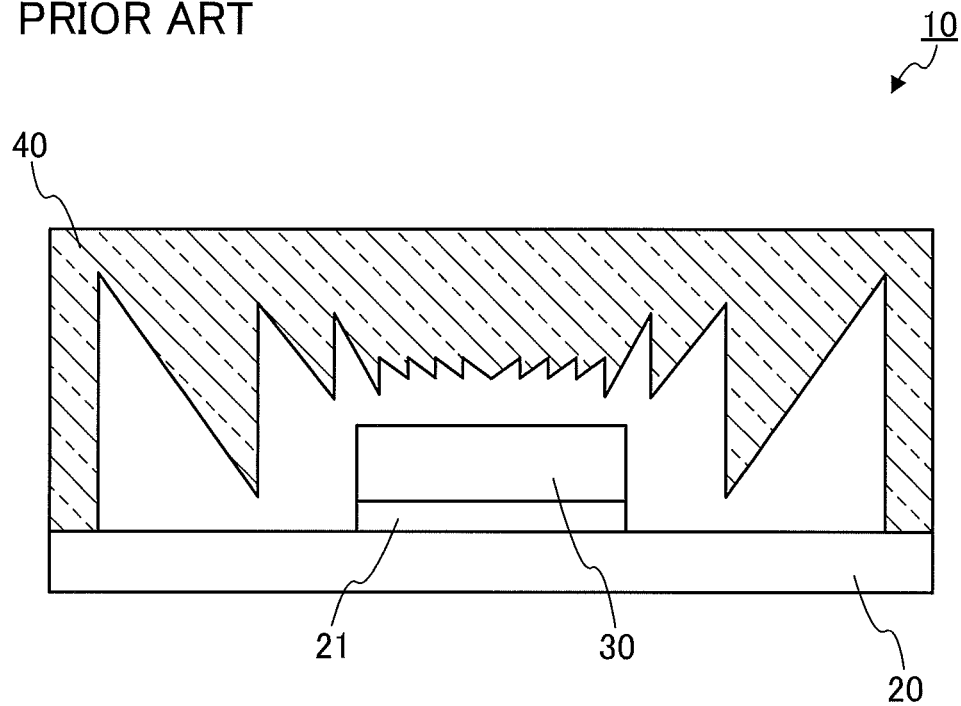
FIG. 1A is a sectional view of the light emitting device disclosed in PTL 1.
Figure 1B:
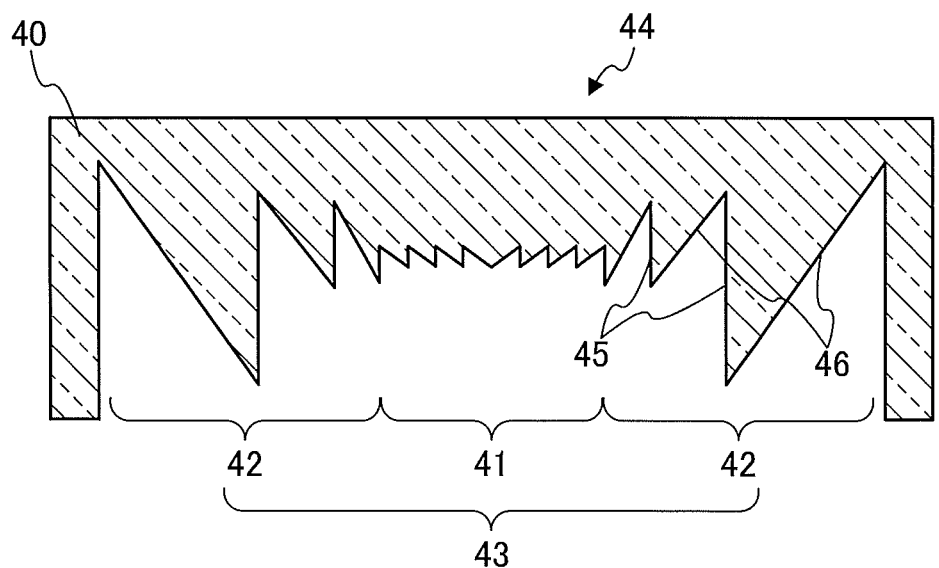
FIG. 1B is a sectional view of the Fresnel lens disclosed in PTL 1.
Figure 2:
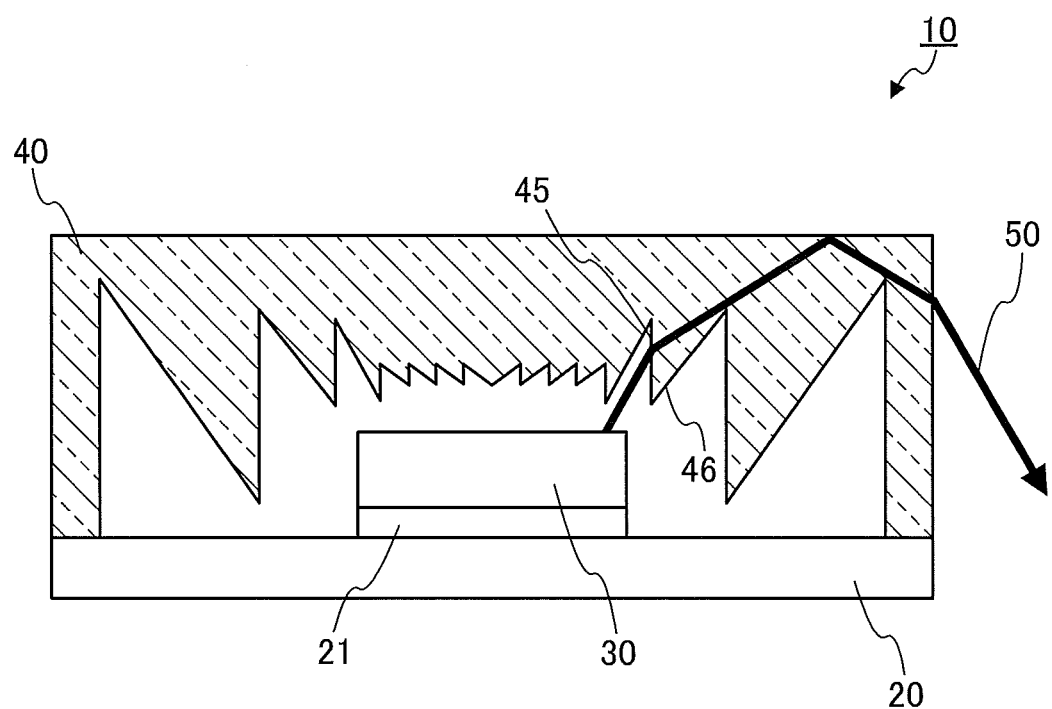
FIG. 2 illustrates a state where stray light is generated in the light emitting device disclosed in PTL 1.
Figure 3A:
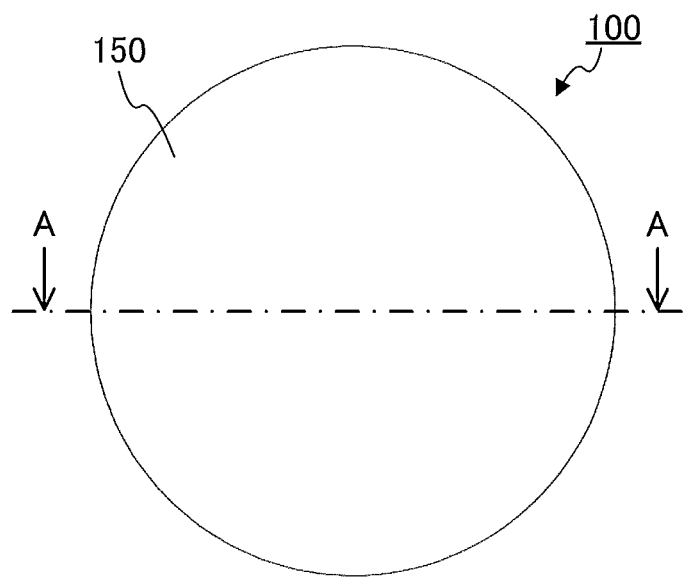
FIG. 3A is a plan view of the light flux controlling member of an embodiment.
Figure 3B:
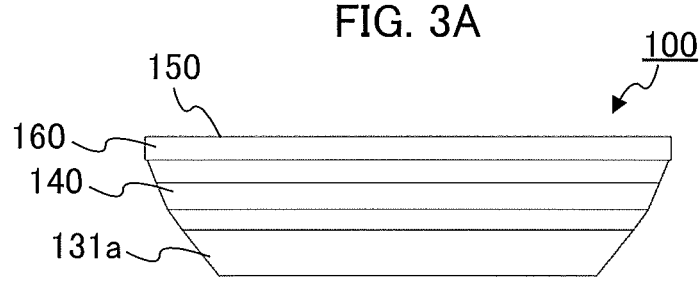
FIG. 3B is a side view of the light flux controlling member of the embodiment.
Figure 3C:
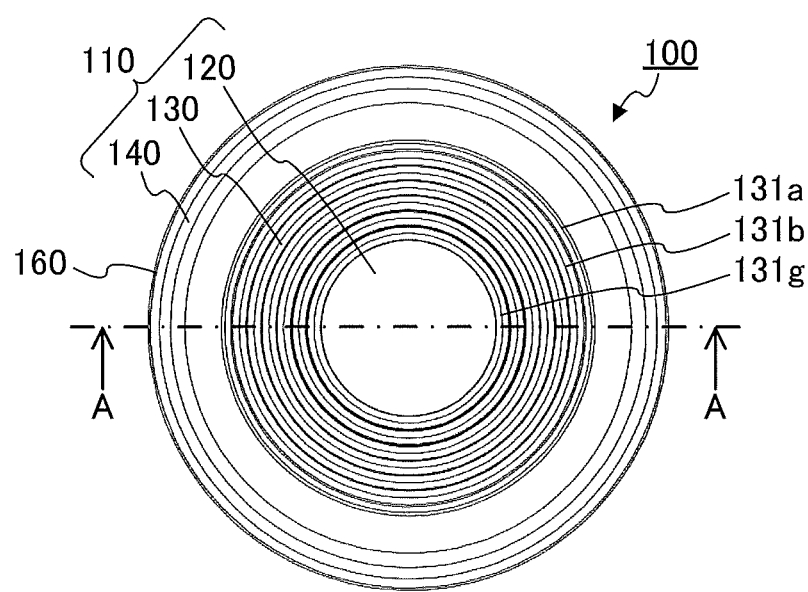
FIG. 3C is a bottom view of the light flux controlling member of the embodiment.
Figure 4A:
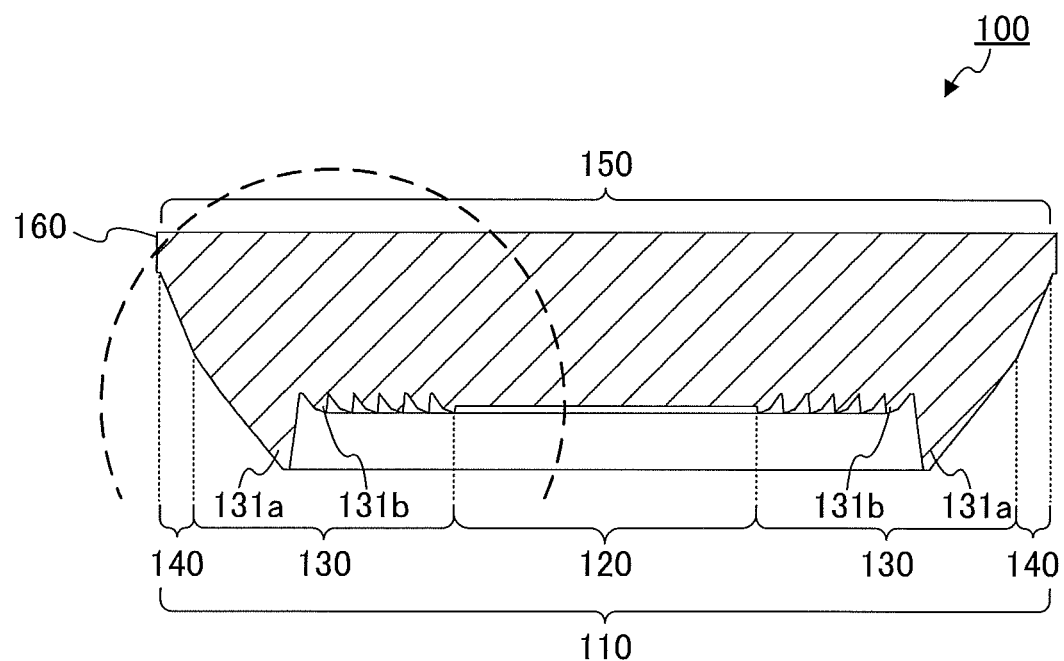
FIG. 4A is a sectional view taken along line A-A of FIG. 3A and FIG. 3C.
Figure 4B:
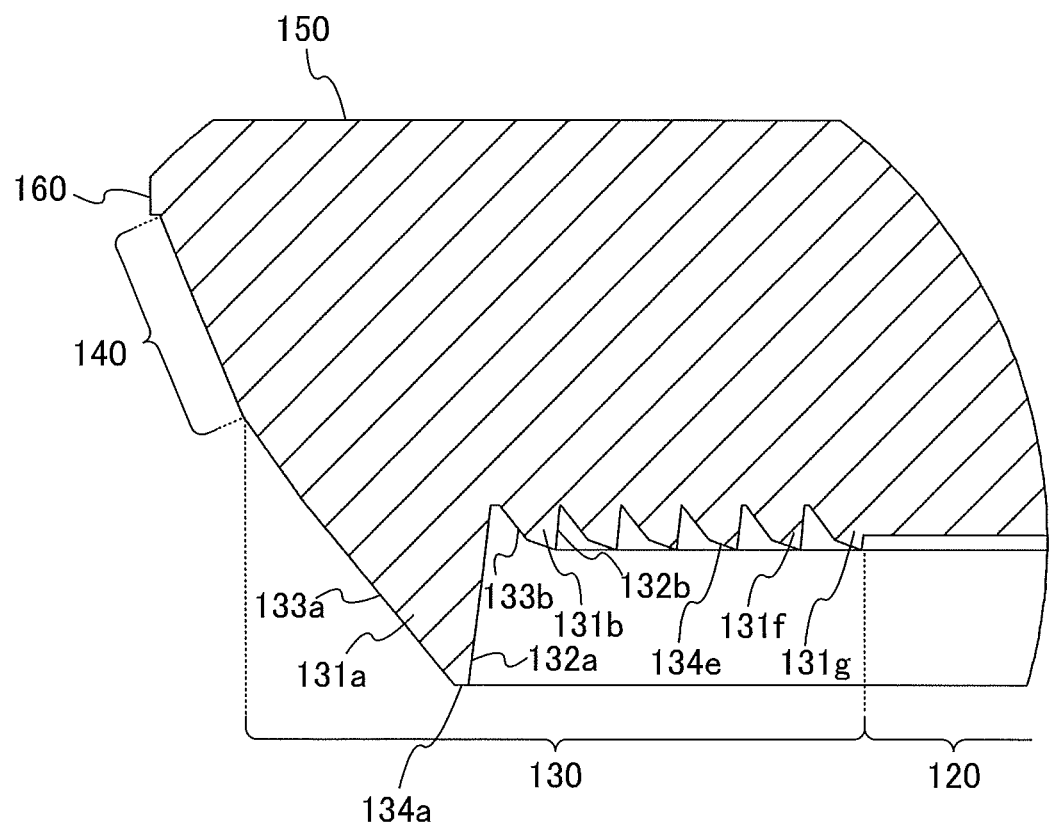
FIG. 4B is a partially enlarged sectional view of the region surrounded by the broken line in FIG. 4A.
Figure 5:
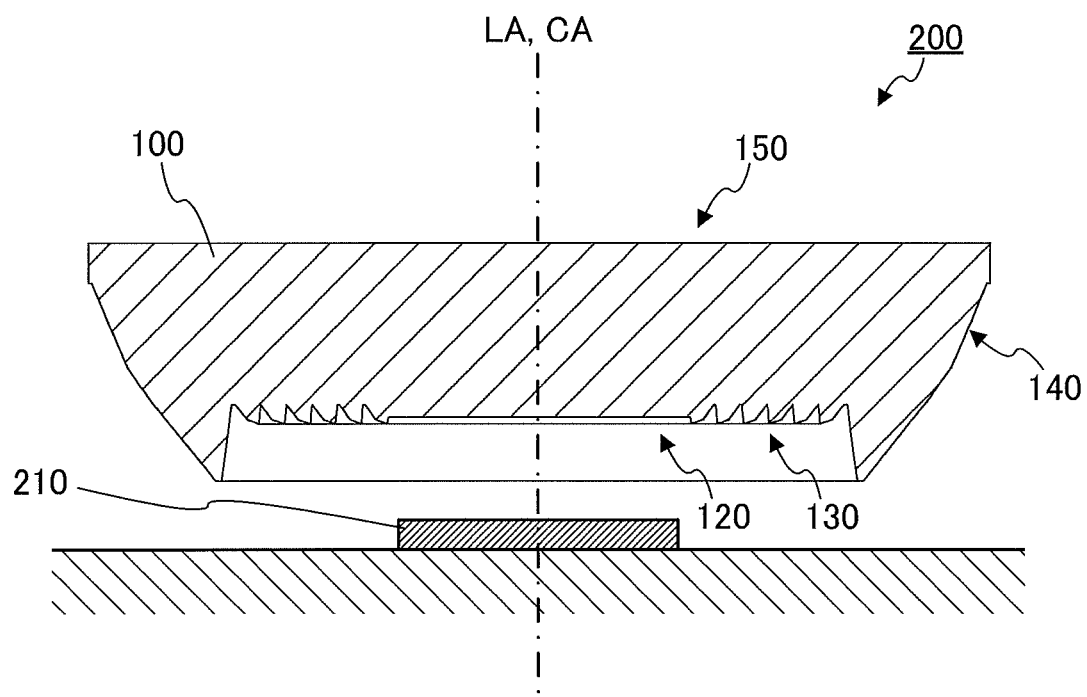
FIG. 5 is a sectional view illustrating a configuration of a light emitting device of the embodiment.

FIG. 3A to FIG. 4B illustrate a configuration of light flux controlling member 100 according to an embodiment of the present invention. FIG. 3A is a plan view of light flux controlling member 100, FIG. 3B is a side view of light flux controlling member 100, and FIG. 3C is a bottom view of light flux controlling member 100. FIG. 4A is a sectional view taken along line A-A of FIG. 3A and FIG. 3C, and FIG. 4B is a partially enlarged sectional view of the region surrounded by the broken line in FIG. 4A. FIG. 5 is a sectional view illustrating a configuration of light emitting device 200 according to the embodiment of the present invention.

As illustrated in FIG. 5, light flux controlling member 100 of the present embodiment is used in combination with light emitting element 210. Light emitting element 210 is a light source of light emitting device 200. Light emitting element 210 is, for example, a light-emitting diode (LED) such as a white light-emitting diode. As illustrated in FIG. 5, light flux controlling member 100 is disposed in such a manner that incidence region 110 (refraction section 120) of light flux controlling member 100 and the light emitting surface of light emitting element 210 face each other.

Light flux controlling member 100 controls the travelling direction of light emitted from light emitting element 210. That is, light flux controlling member 100 controls the distribution of the light emitted from light emitting element 210. Light flux controlling member 100 has a rotationally symmetrical form symmetrical about its central axis CA. Light flux controlling member 100 is disposed in such a manner that its central axis CA matches optical axis LA of light emitting element 210 (see FIG. 5).

Light flux controlling member 100 is formed by injection molding. The material of light flux controlling member 100 is not particularly limited as long as light having a desired wavelength can pass therethrough. Examples of the material of light flux controlling member 100 include: light transmissive resins such as polymethylmethacrylate (PMMA), polycarbonate (PC), and epoxy resin (EP); or glass.

As illustrated in FIG. 4A, light flux controlling member 100 includes incidence region 110 on which light emitted from light emitting element 210 is incident, and emission region 150 that is provided on the side opposite to incidence region 110 and is configured to output the light incident on incidence region 110. Flange 160 may be provided between incidence region 110 and emission region 150.

Incidence region 110 includes refraction section 120 provided at the center portion of incidence region 110, reflective Fresnel lens section 130 provided outside refraction section 120, and reflecting surface 140 provided outside reflective Fresnel lens section 130.

Refraction section 120 is a planar surface formed at a position facing light emitting element 210 in such a manner as to intersect with central axis CA of light flux controlling member 100. Refraction section 120 allows part of light emitted from light emitting element 210 (light emitted mainly in a forward direction) to enter light flux controlling member 100, and refracts the incident light toward emission region 150 (see FIG. 12). It is to be noted that the form of refraction section 120 may not necessarily be the planar surface, as long as the above-mentioned function can be achieved. For example, refraction section 120 may be a spherical surface, an aspherical surface, or a refractive Fresnel lens. In the present embodiment, refraction section 120 has a rotationally symmetrical form symmetrical about central axis CA of light flux controlling member 100 (see FIG. 3C).

Figure 12:
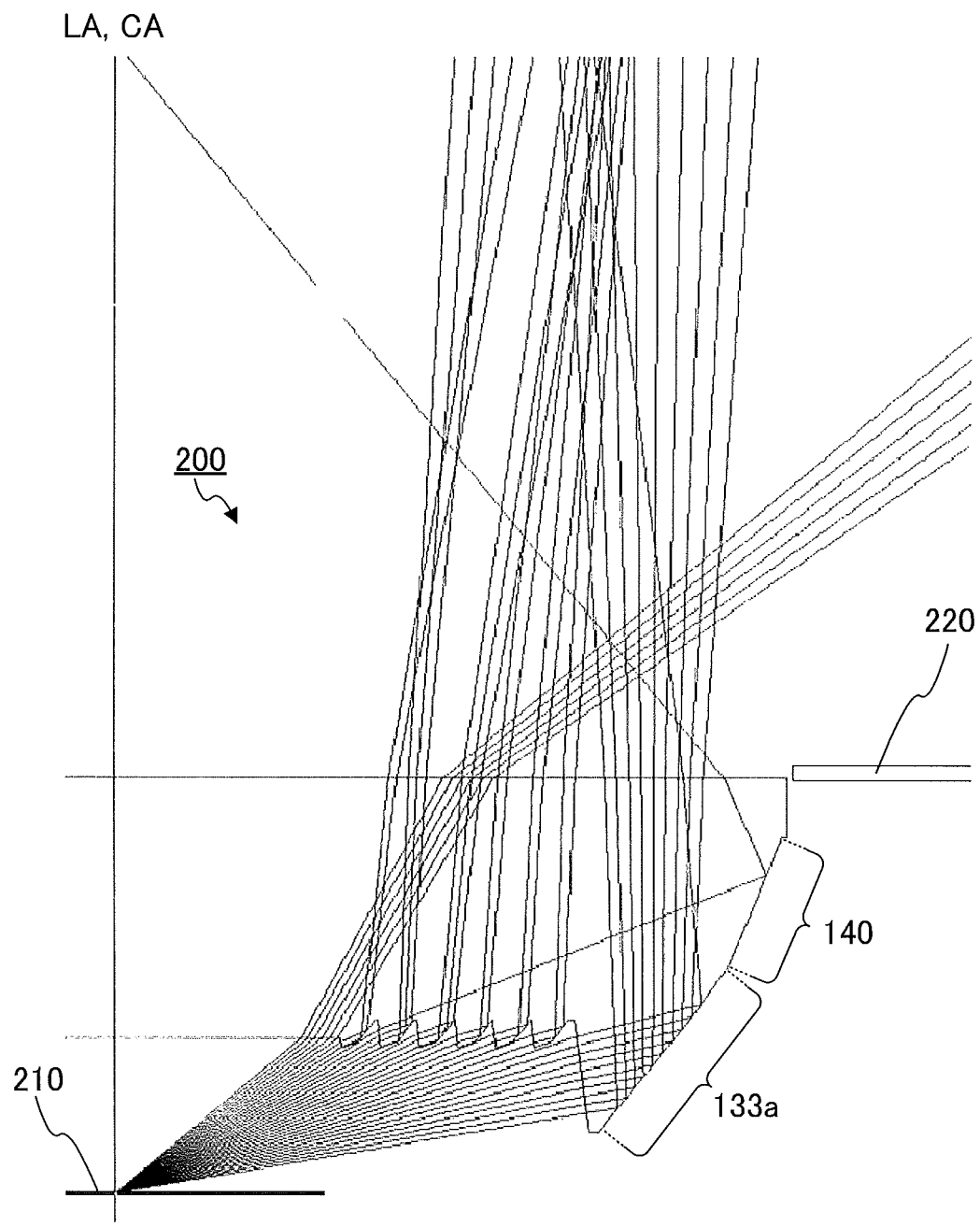
FIG. 12 illustrates light paths of the light emitting device of the embodiment.

Reflective Fresnel lens section 130 allows part of light emitted from light emitting element 210 (light emitted mainly in a lateral direction) to enter light flux controlling member 100, and reflects the incident light toward emission region 150 (see FIG. 12). Reflective Fresnel lens section 130 has a rotationally symmetrical form symmetrical about central axis CA of light flux controlling member 100, and reflective Fresnel lens section 130 includes a plurality of annular projections 131 which are concentrically disposed (see FIG. 3C). As illustrated in FIG. 3C and FIG. 4B, in this specification, projection 131 provided at the outermost position among annular projections 131 is referred to as first projection 131a, and in the order from the outer side, annular projections 131 are respectively referred to as second projection 131b to seventh projection 131g. To take in light emitted in a lateral direction from light emitting element 210, first projection 131a has a size larger than that of projections 131b to 131g.

Each projection 131 includes first inclined surface 132 serving as an incidence surface on which light emitted from light emitting element 210 is incident, and second inclined surface 133 serving as a reflecting surface which reflects light incident on first inclined surface 132 toward emission region 150. In each projection 131, first inclined surface 132 is provided on the inner side (on central axis CA side), and second inclined surface 133 is provided on the outer side. In addition, in each projection 131, first inclined surface 132 and second inclined surface 133 may either be continuous or discontinuous with each other. In the former case, a ridgeline is formed between first inclined surface 132 and second inclined surface 133. In the latter case, another surface is formed between first inclined surface 132 and second inclined surface 133. In the example illustrated in FIG. 4B, third inclined surface 134 is formed between first inclined surface 132 and second inclined surface 133. When third inclined surface 134 is provided between first inclined surface 132 and second inclined surface 133 to eliminate an acute-angle portion (ridgeline portion), the manufacturing performance can be improved. It should be noted that the light flux control efficiency of projection 131 provided with third inclined surface 134 is lower than that of projection 131 provided with no third inclined surface 134. The reason for this is that the amount of light which does not incident on projection 131 provided with third inclined surface 134 and becomes leaked light is increased. Reflecting surface 140 described later makes it possible to control the travelling direction of the leaked light, and can improve the light use efficiency.

The generatrix of first inclined surface 132 may either be a straight line or a curved line. The angle of first inclined surface 132 relative to optical axis LA of light emitting element 210 is not particularly limited as long as light incident on first inclined surface 132 can be refracted to second inclined surface 133 side, and is appropriately set in accordance with the size, position, or the like of light emitting element 210. It is to be noted that, when the generatrix of first inclined surface 132 is a curved line, "the angle of first inclined surface 132" is the angle of the tangent to the generatrix of first inclined surface 132. In view of the manufacturing performance, first inclined surface 132 is preferably inclined relative to optical axis LA of light emitting element 210 by about 3 to 5 degrees such that first inclined surface 132 on emission region 150 side is closer to the optical axis in comparison with incidence region 110 side. It is to be noted that the angle of first inclined surface 132 may either be the same or different among projections 131.

The generatrix of second inclined surface 133 may either be a straight line or a curved line. The angle of second inclined surface 133 relative to optical axis LA of light emitting element 210 is not particularly limited as long as light incident on first inclined surface 132 can be reflected toward emission region 150 side, and may be appropriately set in accordance with the intended light distribution performance or the like. It is to be noted that, when the generatrix of second inclined surface 133 is a curved line, "the angle of second inclined surface 133" is the angle of the tangent to the generatrix of second inclined surface 133. Normally, second inclined surface 133 is inclined relative to the optical axis by about 20 to 50 degrees such that second inclined surface 133 on incidence region 110 side is closer to the optical axis in comparison with emission region 150 side. The angle of second inclined surface 133 may either be the same or different among projections 131.

Reflecting surface 140 is a surface extending from the outer edge of reflective Fresnel lens section 130 to the outer edge of emission region 150. Flange 160 may be provided between the outer edge of reflecting surface 140 and the outer edge of the emission region 150. Reflecting surface 140 reflects, toward emission region 150, light which is incident on light flux controlling member 100 from first inclined surface 132 of reflective Fresnel lens section 130 and is not reflected by second inclined surface 133 of reflective Fresnel lens section 130 (in other words, leaked light from reflective Fresnel lens section 130) (see FIG. 13).

Reflecting surface 140 is a rotationally symmetrical surface which is formed in such a manner as to surround central axis CA of light flux controlling member 100 (see FIG. 3C). The diameter of reflecting surface 140 gradually increases from incidence region 110 (light emitting element 210) side toward emission region 150 side. The generatrix of reflecting surface 140 may either be a straight line or a curved line. The angle of reflecting surface 140 relative to optical axis LA of light emitting element 210 (central axis CA of light flux controlling member 100) is greater than 0 and smaller than the angle of second inclined surface 133a provided at the outermost position, relative to optical axis LA of light emitting element 210. Here, "the angle of reflecting surface 140" means the maximum value of the angle of the tangent to the generatrix of reflecting surface 140. In addition, "the angle of second inclined surface 133a provided at the outermost position" means the minimum value of the angle of the tangent to the generatrix of second inclined surface 133a.

Figure 6A:
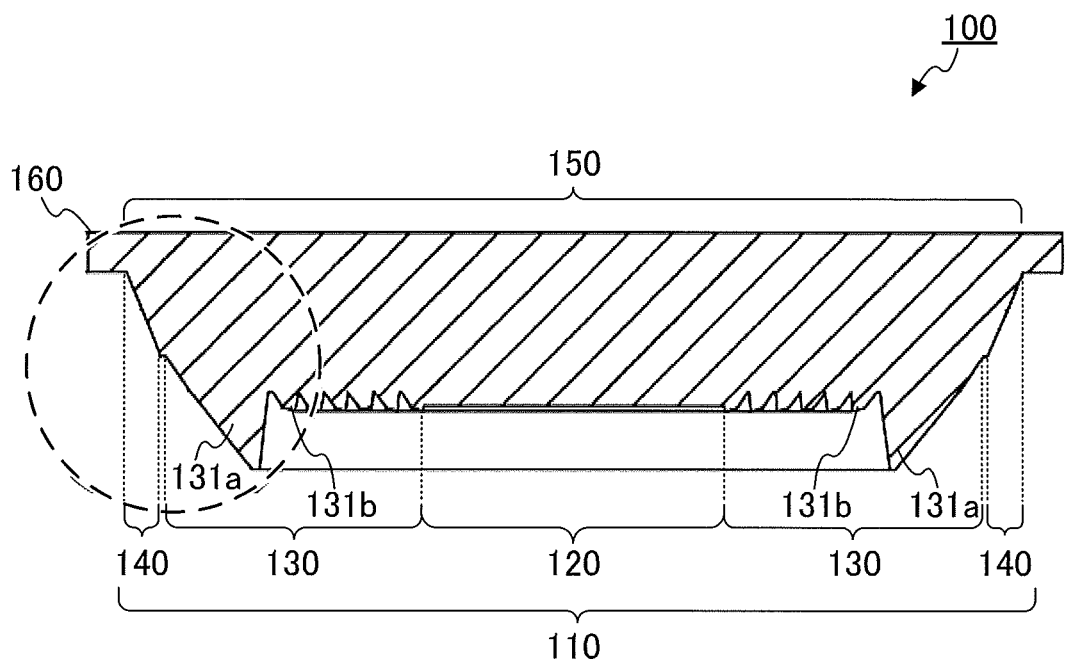
FIG. 6A is a sectional view of a light flux controlling member in which a reflecting surface and a second inclined surface are discontinuous with each other.
Figure 6B:
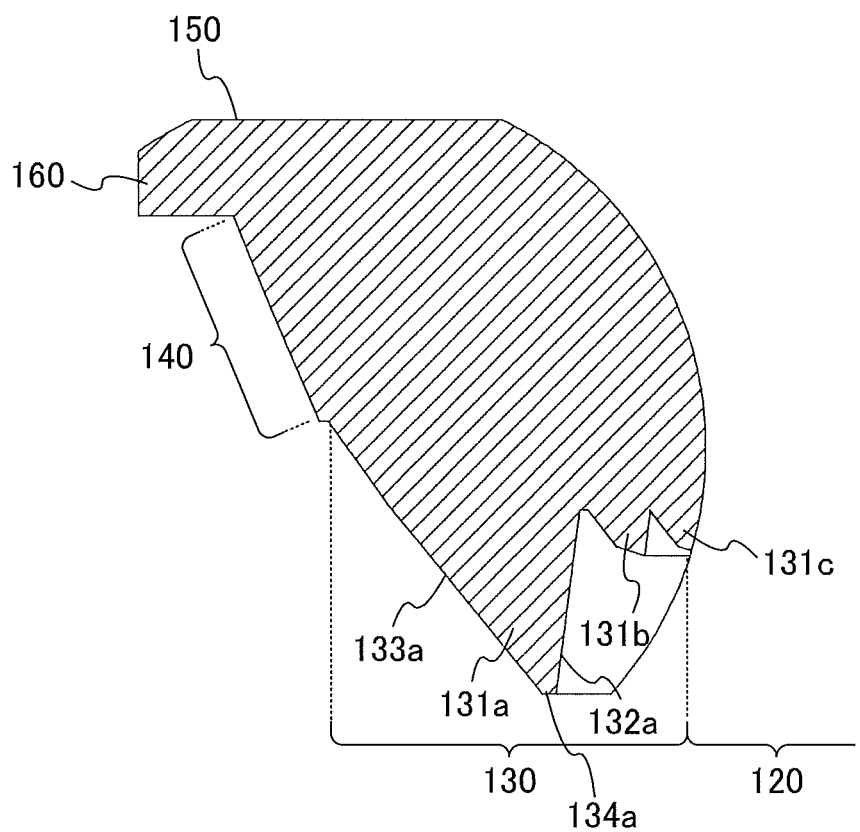
FIG. 6B is a partially enlarged sectional view of the region surrounded by the broken line in FIG. 6A.

The position of reflecting surface 140 is not particularly limited as long as leaked light from reflective Fresnel lens section 130 can be reflected toward emission region 150. For example, reflecting surface 140 is formed on emission region 150 side, with respect to straight line L passing through light emission center 212 of light emitting element 210 and valley bottom 135 located between first projection 131a and second projection 131b (see FIG. 9). With this configuration, only beams of light (leaked light) which are incident on first inclined surfaces 132b to 132g of small projections 131b to 131g (projections other than first projection 131a), and have not reached second inclined surfaces 133b to 133g reach reflecting surface 140 (light incident on first inclined surface 132a of first projection 131a does not reach). It is to be noted that reflecting surface 140 may be continuous with second inclined surface 133a of first projection 131a (see FIG. 4A and FIG. 4B), or discontinuous with second inclined surface 133a of first projection 131a (see FIG. 6A and FIG. 6B).

Emission region 150 is a planar surface which is formed on the side opposite to light emitting element 210 in such a manner as to face the irradiation target region. Emission region 150 is so formed as to intersect with central axis CA of light flux controlling member 100. As illustrated in FIG. 3A, emission region 150 is a rotationally symmetrical surface symmetrical about central axis CA of light flux controlling member 100. Emission region 150 outputs the following light toward the irradiation target region: 1) the light which is incident on refraction section 120; 2) the light which is incident on first inclined surface 132 of reflective Fresnel lens section 130, and is reflected by second inclined surface 133; and 3) the light which is incident on first inclined surface 132 of reflective Fresnel lens section 130, and is reflected by reflecting surface 140.

[Simulation of Light Path]

Light paths of light emitted from light emitting element 210 in light emitting device 200 including light flux controlling member 100 of the present embodiment illustrated in FIG. 5 were simulated. In addition, for comparison, light paths of light emitted from light emitting element 210 also in light emitting device 200' including light flux controlling member 100' of the comparative example illustrated in FIG. 7A to FIG. 8B were simulated.

Figure 7A:
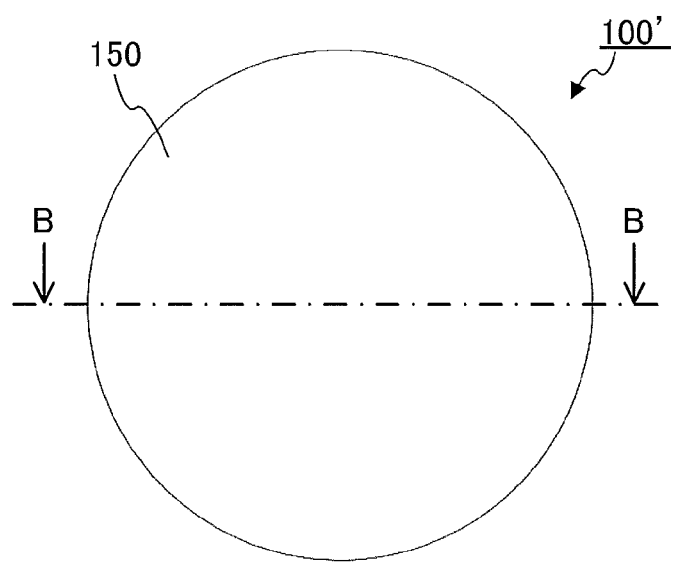
FIG. 7A is a plan view of a light flux controlling member of a comparative example.
Figure 7B:
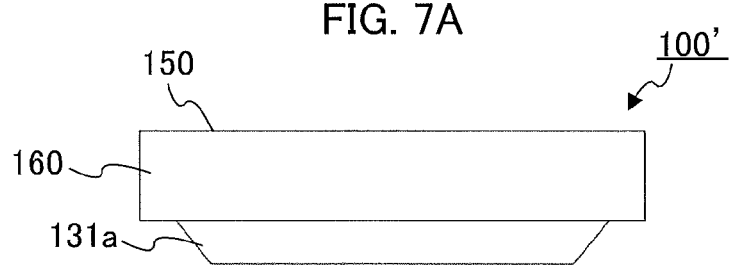
FIG. 7B is a side view of the light flux controlling member of the comparative example.
Figure 7C:
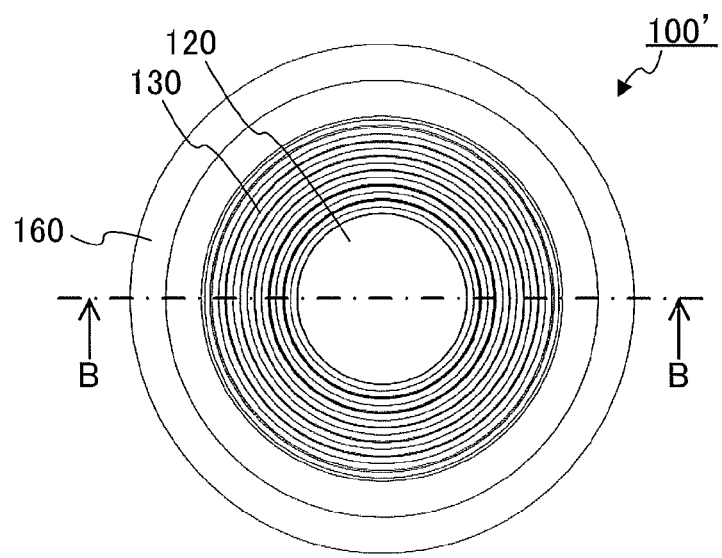
FIG. 7C is a bottom view of the light flux controlling member of the comparative example.
Figure 8A:
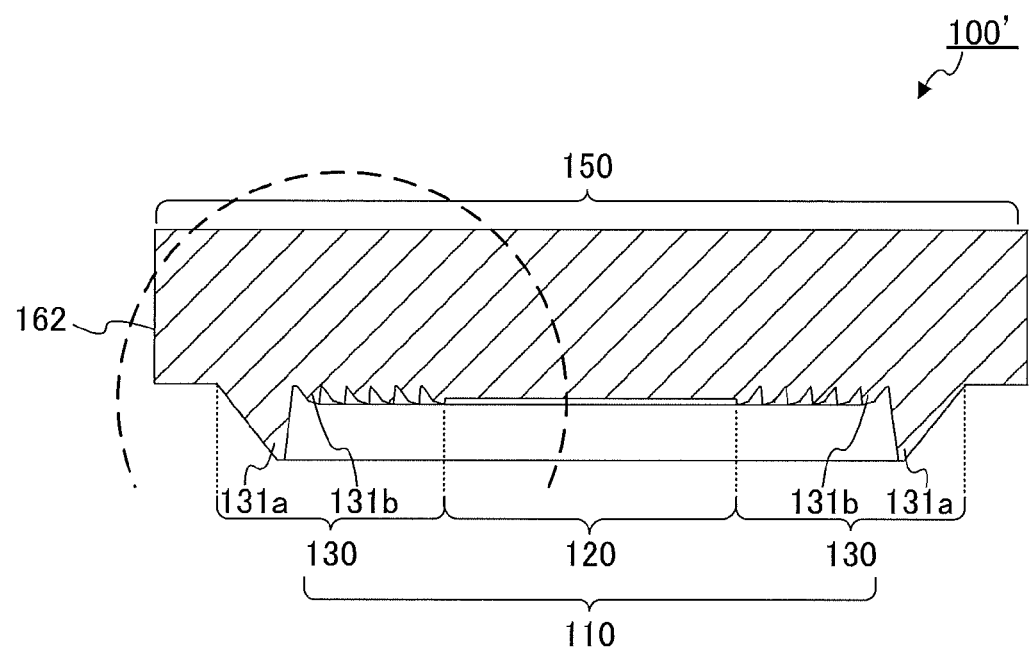
FIG. 8A is a sectional view taken along line B-B of FIG. 7A and FIG. 7C.
Figure 8B:
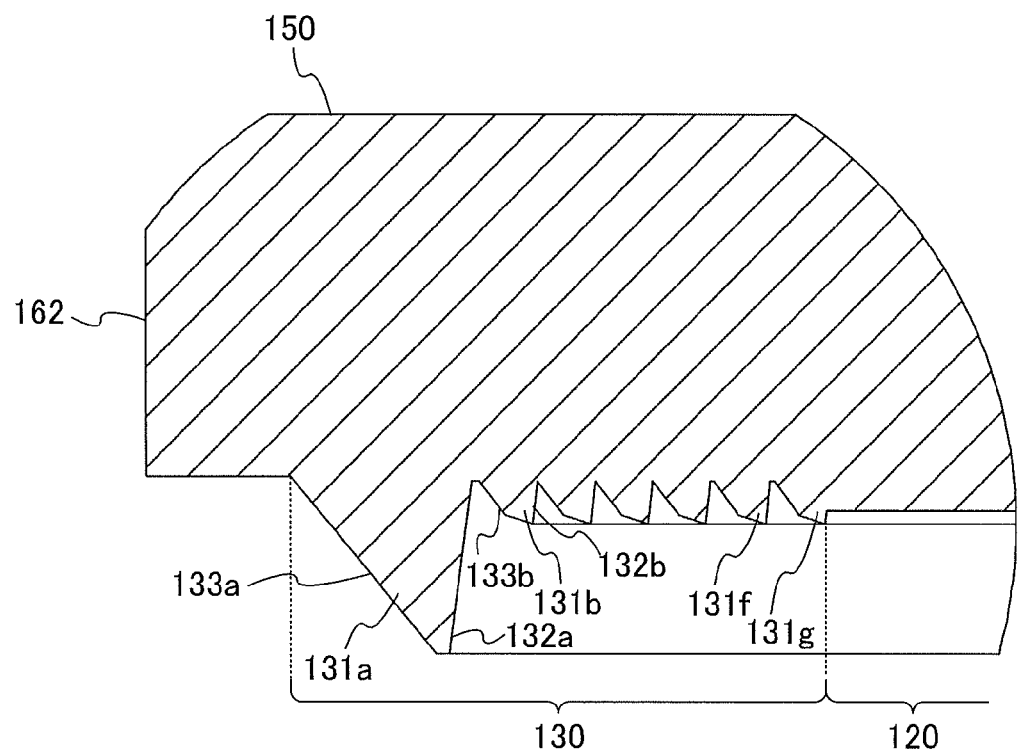
FIG. 8B is a partially enlarged sectional view of the region surrounded by the broken line in FIG. 8A.

FIG. 7A is a plan view of light flux controlling member 100' of the comparative example, FIG. 7B is a side view of light flux controlling member 100' of the comparative example, and FIG. 7C is a bottom view of light flux controlling member 100' of the comparative example. FIG. 8A is a sectional view taken along line B-B of FIG. 7A and FIG. 7C, and FIG. 8B is a partially enlarged sectional view of the region surrounded by the broken line in FIG. 8A. As illustrated in FIG. 7A to FIG. 8B, light flux controlling member 100' of the comparative example is different from light flux controlling member 100 of the present embodiment in that reflecting surface 140 is not provided at an outer edge of reflective Fresnel lens section 130.

Figure 9:
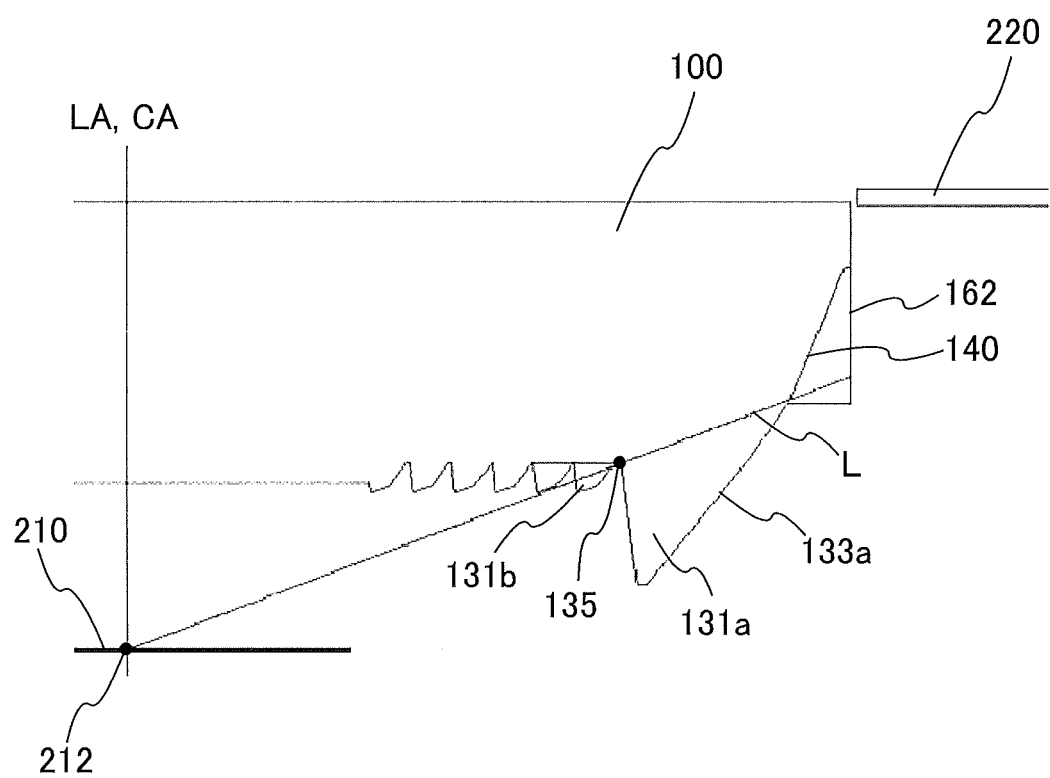
FIG. 9 is a sectional view for describing the difference in form between the light flux controlling member of the embodiment and the light flux controlling member of the comparative example.

FIG. 9 illustrates partially enlarged sectional views of light flux controlling members 100 and 100' in an overlapped manner so as to show the difference in form between light flux controlling member 100 of the embodiment and light flux controlling member 100' of the comparative example. As illustrated in FIG. 9, in light flux controlling member 100 of the embodiment, reflecting surface 140 is formed on emission region 150 side, with respect to straight line L passing through light emission center 212 of light emitting element 210 and valley bottom 135 located between first projection 131a and second projection 131b.

On the other hand, in light flux controlling member 100' of the comparative example, flange outer peripheral surface 162 in parallel with optical axis LA is formed in place of reflecting surface 140. It is to be noted that, as illustrated in FIG. 9, in this simulation, diaphragm 220 was disposed outside emission region 150.

Figure 10:
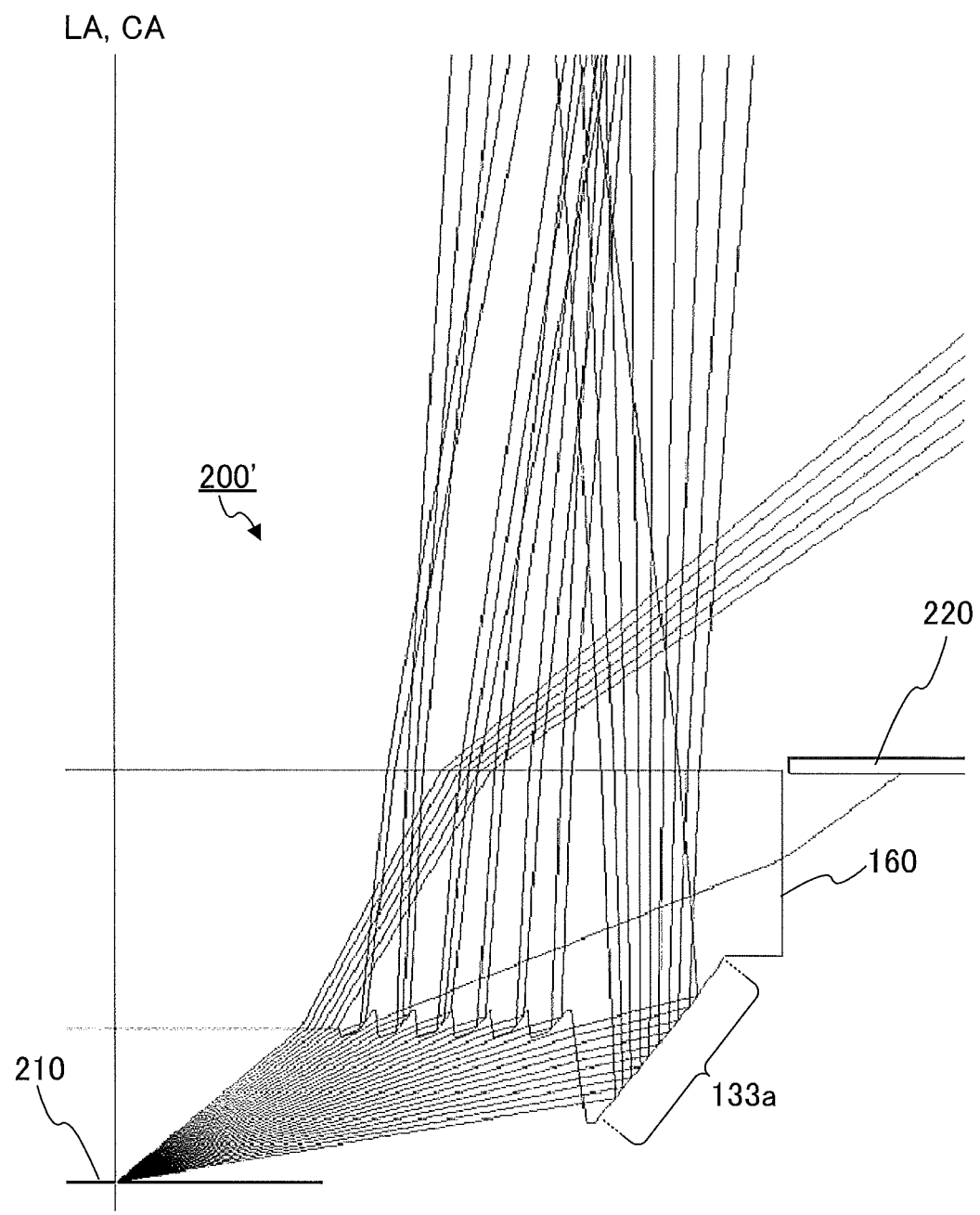
FIG. 10 illustrates light paths of a light emitting device of the comparative example.
Figure 11:
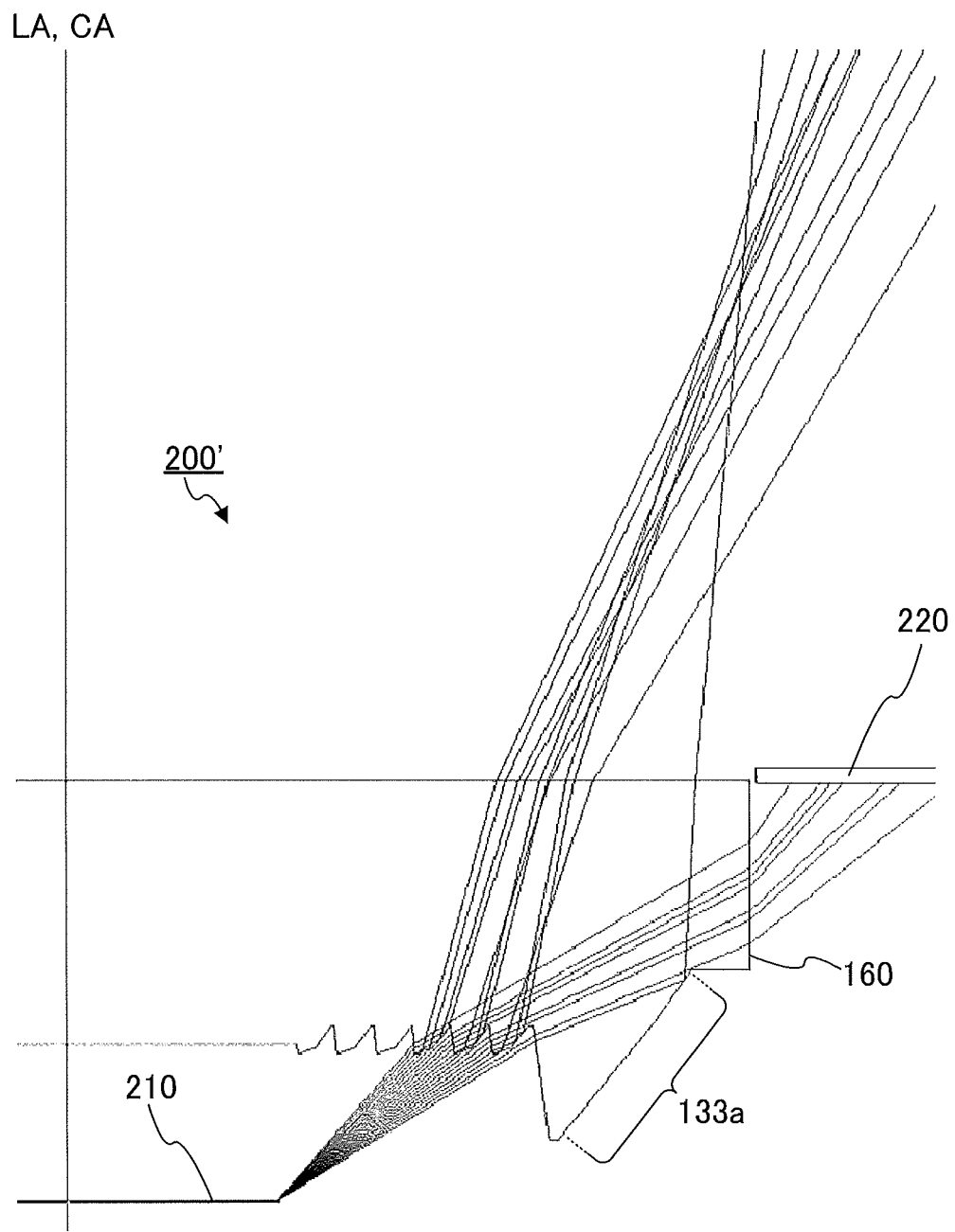
FIG. 11 illustrates light paths of the light emitting device of the comparative example.

FIG. 10 and FIG. 11 illustrate light paths of light emitting device 200' of the comparative example. FIG. 10 illustrates light paths of light emitted from the light emission center of light emitting element 210, and FIG. 11 illustrates light paths of light emitted from a peripheral portion of light emitting element 210.

As illustrated in FIG. 10, light emitted in a forward direction from the light emission center of light emitting element 210 enters light flux controlling member 100' from refraction section 120, and is output from emission region 150. In addition, light emitted in a lateral direction from the light emission center of light emitting element 210 enters light flux controlling member 100' from first inclined surfaces 132a to 132g of projections 131a to 131g of light reflective Fresnel lens section 130. The beams of light incident on first inclined surfaces 132a to 132g are respectively reflected by second inclined surfaces 133a to 133g of projections 131a to 131g, and are output from emission region 150.

On the other hand, as illustrated in FIG. 11, light emitted in a lateral direction from a peripheral portion of light emitting element 210 enters light flux controlling member 100' from first inclined surfaces 132a to 132g of projections 131a to 131g of reflective Fresnel lens section 130. Part of the light incident on first inclined surfaces 132a to 132g is reflected by second inclined surfaces 133a to 133g of respective projections, and is output from emission region 150. However, the remaining part of the light incident on first inclined surfaces 132a to 132g cannot reach second inclined surfaces 133a to 133g of projections 131a to 131g, and becomes leaked light. Such leaked light becomes stray light, and is output from flange outer peripheral surface 162. Thus, leaked light from reflective Fresnel lens section 130 is not utilized for illumination of the irradiation target region.

Figure 13:
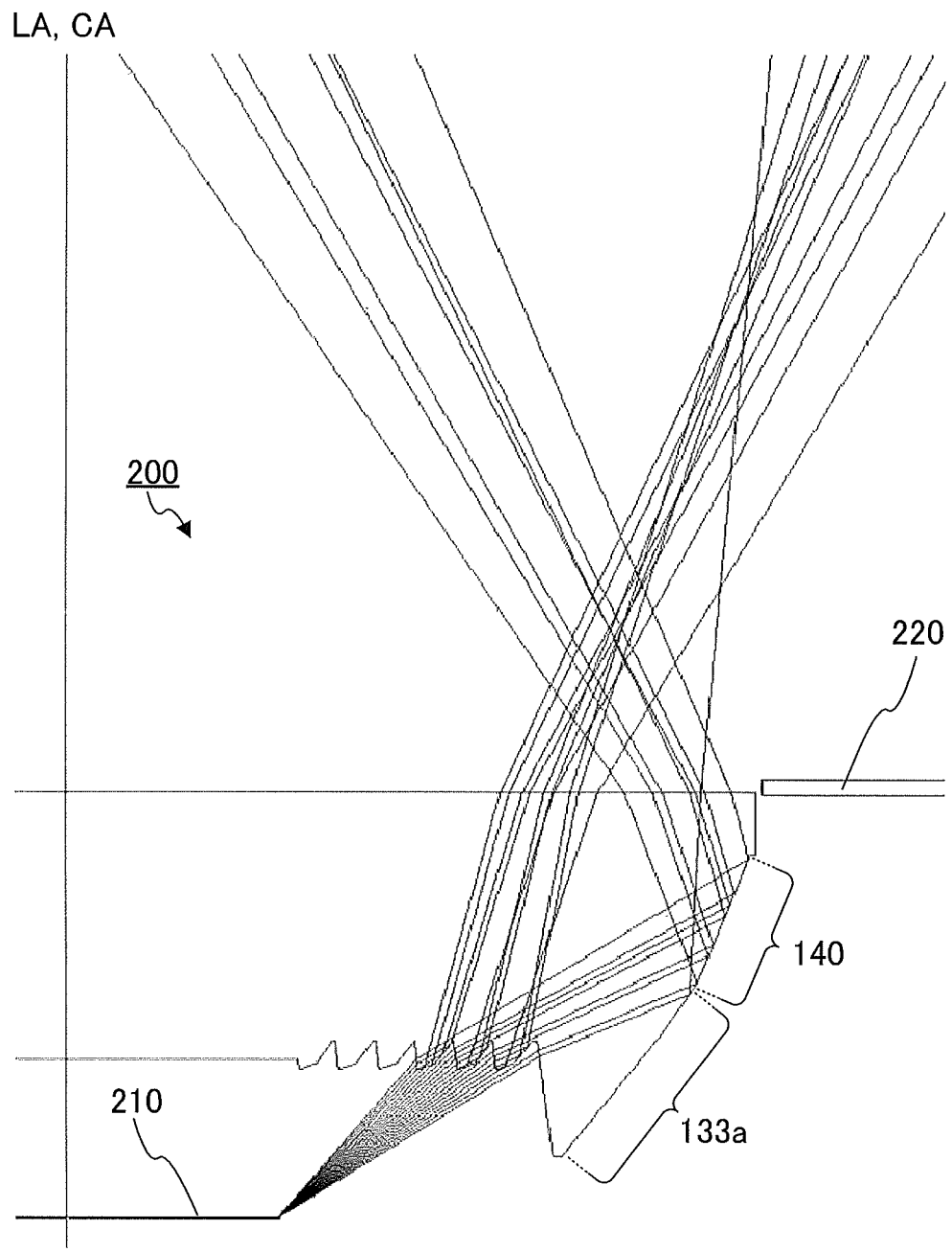
FIG. 13 illustrates light paths of the light emitting device of the embodiment.

FIG. 12 and FIG. 13 illustrate light paths of light emitting device 200 of the embodiment. FIG. 12 illustrates light paths of light emitted from the light emission center of light emitting element 210, and FIG. 13 illustrates light paths of light emitted from a peripheral portion of light emitting element 210.

As illustrated in FIG. 12, light emitted in a forward direction from the light emission center of light emitting element 210 enters light flux controlling member 100 from refraction section 120, and is output from emission region 150. In addition, light emitted in a lateral direction from the light emission center of light emitting element 210 enters light flux controlling member 100 from first inclined surfaces 132a to 132g of projections 131a to 131g of reflective Fresnel lens section 130. The beams of light incident on first inclined surfaces 132a to 132g are respectively reflected by second inclined surfaces 133a to 133g of projections 131a to 131g, and are output from emission region 150.

In addition, as illustrated in FIG. 13, also in light emitting device 200 of the embodiment, part of light emitted in a lateral direction from a peripheral portion of light emitting element 210 becomes leaked light from reflective Fresnel lens section 130. However, in light emitting device 200 of the embodiment, such leaked light is reflected by reflecting surface 140, and is output from emission region 150. Thus, the leaked light is also utilized for illumination of the irradiation target region.

As can be seen from the light paths illustrated in the drawings, light emitting device 200 of the present embodiment can utilize leaked light from reflective Fresnel lens section 130 for illumination of the irradiation target region.

[Simulation of Illuminance]

The illuminance distributions on the illuminated surfaces in light emitting device 200 of the present embodiment and light emitting device 200' of the comparative example were simulated. A planar surface which is disposed perpendicularly to optical axis LA of light emitting element 210 at a position separated by 1 m from light emitting element 210, was used as the illuminated surface. It is to be noted that light flux controlling members 100 and 100' each have a diameter of 10 mm.

Figure 14:
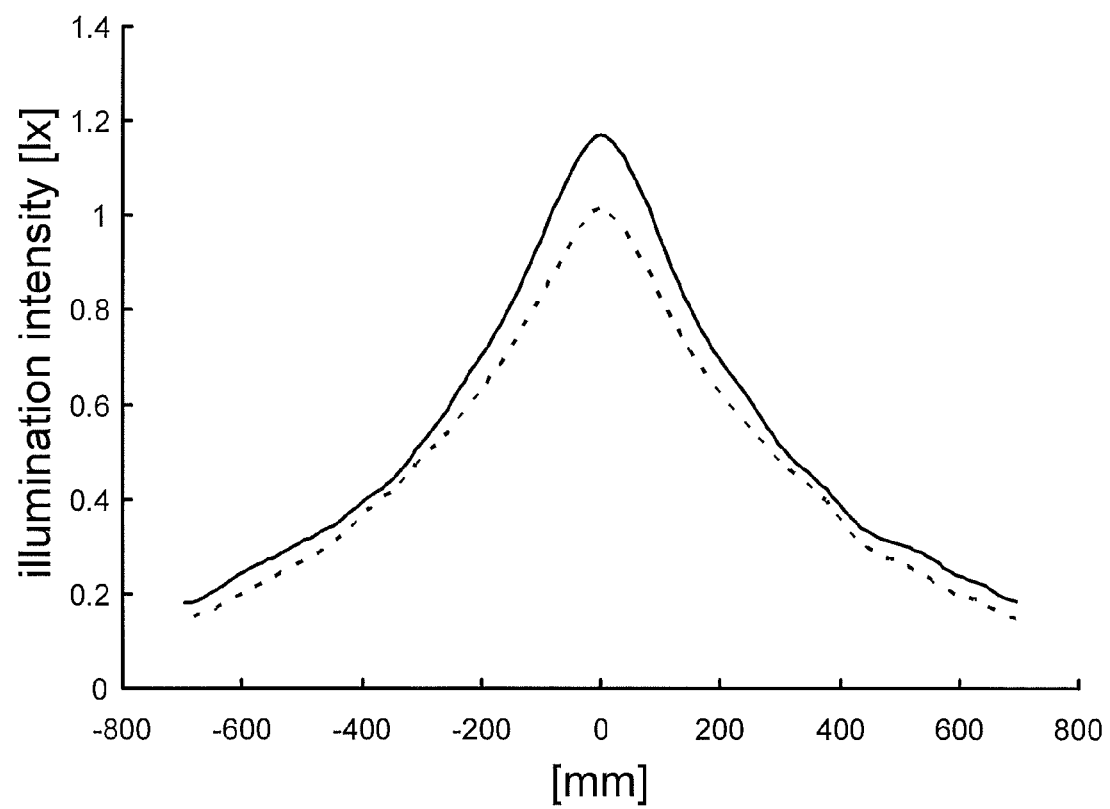
FIG. 14 is a graph illustrating results of a simulation of an illuminance distribution for the total light flux.
Figure 15:
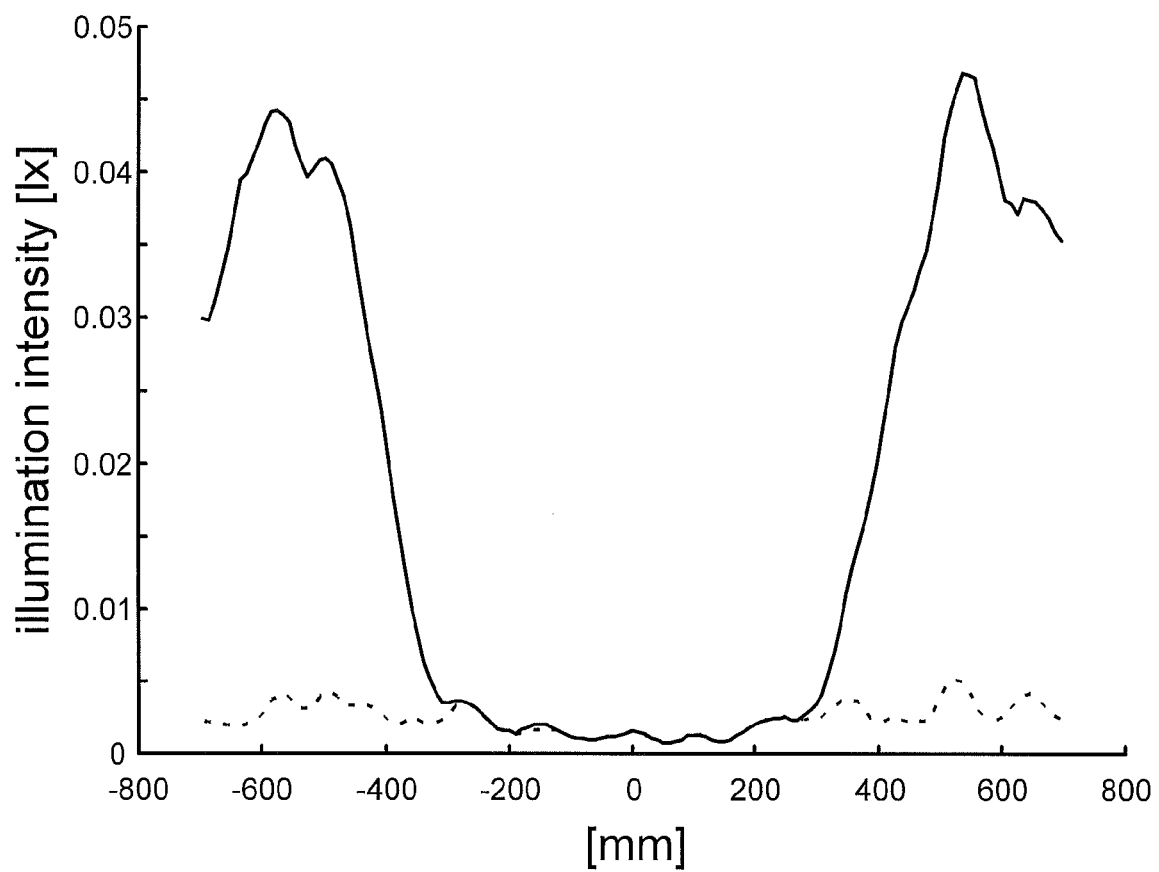
FIG. 15 is a graph illustrating results of a simulation of an illuminance distribution for leaked light.

FIG. 14 is a graph illustrating an illuminance distribution on the illuminated surface for the total light flux. FIG. 15 is a graph illustrating an illuminance distribution on the illuminated surface for leaked light from reflective Fresnel lens section 130. In the graphs, the abscissa represents the distance from the center of the illuminated surface (the point which intersects with the optical axis of light emitting element 210), and the ordinate represents the illuminance. The broken line represents simulation results of light emitting device 200' of the comparative example, and the solid line represents simulation results of light emitting device 200 of the embodiment.

As can be seen from the graph of FIG. 14, light emitting device 200 of the present embodiment can illuminate the illuminated surface more brightly than light emitting device 200' of the comparative example. In addition, as can be seen from the graph of FIG. 15, light emitting device 200 of the present embodiment distributes leaked light from reflective Fresnel lens section 130 to the peripheral portion of illuminated surface.

[Effect]

Light flux controlling member 100 of the present embodiment can utilize leaked light from reflective Fresnel lens section 130 for illumination of the irradiation target region, as well as the light refracted by refraction section 120 and the light reflected by reflective Fresnel lens section 130. Therefore, light flux controlling member 100 of the present embodiment is excellent in light use efficiency. In addition, in light flux controlling member 100 of the present embodiment, leaked light from reflective Fresnel lens section 130 does not become stray light, and thus the influence of stray light on the other components can be limited. Therefore, light emitting device 200 including light flux controlling member 100 of the present embodiment has only a little influence on the other components, and is excellent in light use efficiency.

INDUSTRIAL APPLICABILITY

The light flux controlling member of the embodiment of the present invention is suitable for, for example, a lens of a light emitting device (flash) of an imaging camera and the like.

This application is entitled to and claims the benefit of Japanese Patent Application No. 2012-015270, filed on Jan. 27, 2012, the disclosure of which including the specification, drawings and abstract is incorporated herein by reference in its entirety.

REFERENCE SIGNS LIST

10 Light emitting device
20 Substrate
21 Light source substrate
30 Light source
40 Fresnel lens
41 Refractive Fresnel lens section
42 Reflective Fresnel lens section
43 Incidence region
44 Emission region
45 Incidence surface
46 Reflecting surface
100 Light flux controlling member
110 Incidence region
120 Refraction section
130 Reflective Fresnel lens section
131 Projection
132 First inclined surface
133 Second inclined surface
134 Third inclined surface
135 Valley bottom
140 Reflecting surface
150 Emission region
160 Flange
162 Flange outer peripheral surface
200 Light emitting device
210 Light emitting element
212 Light emission center
220 Diaphragm
CA Central axis of light flux controlling member
L Straight line passing through light emission center and valley bottom
LA Optical axis of light emitting element

The invention claimed is:

1. A light emitting device comprising:
a light emitting element; and
a light flux controlling member that controls a distribution of light emitted from the light emitting element, wherein
the light flux controlling member comprises:
an incidence region on which light emitted from the light emitting element is incident; and
an emission region from which light incident on the incidence region is emitted,
the incidence region includes:
a refraction section on which part of light emitted from the light emitting element is incident, the refraction section being configured to refract incident light toward the emission region;
a reflective fresnel lens section which is disposed outside the refraction section, and on which part of light emitted from the light emitting element is incident, the reflective fresnel lens section being configured to reflect incident light toward the emission region; and
a reflecting surface which is disposed outside the reflective fresnel lens section, the reflecting surface being configured to reflect, toward the emission region, light which is incident on the reflective fresnel lens section and is not reflected by the reflective fresnel lens section,
the reflective fresnel lens section includes a plurality of concentric annular projections, each of the projections including a first inclined surface on which part of light emitted from the light emitting element is incident and a second inclined surface configured to reflect light incident on the first inclined surface toward the emission region,
the reflecting surface is configured to reflect light which is part of light emitted in a lateral direction from a peripheral portion of the light emitting element, is incident on a first inclined surface of a second projection adjacent to a first projection provided at an outermost position of the reflective fresnel lens section, and is not reflected by a second inclined surface of the second projection, and an angle of the reflecting surface with respect to an optical axis of the light emitting element is smaller than an angle of a second inclined surface of the first projection with respect to the optical axis of the light emitting element.

2. The light emitting device according to claim 1, wherein the reflecting surface is formed on the emission region side with respect to a straight line passing through a light emission center of the light emitting element and a valley bottom located between the first projection and the second projection.

3. The light emitting device according to claim 1, wherein the refraction section is a planar surface, a spherical surface, an aspherical surface, or a refractive fresnel lens.

4. The light emitting device according to claim 1, wherein the reflecting surface and the second inclined surface of the first projection are continuous with each other.

5. The light emitting device according to claim 1, wherein the reflecting surface and the second inclined surface of the first projection are discontinuous with each other.

* * * * *